United States Patent [19]
Jenq et al.

[11] Patent Number: 5,874,335
[45] Date of Patent: Feb. 23, 1999

[54] METHOD OF FABRICATING DRAM CAPACITORS

[75] Inventors: Jason Jenq, Pingtung; Sun-Chieh Chien, Hsinchu, both of Taiwan

[73] Assignee: United Microelectronics Corp., Hsin-Chu, Taiwan

[21] Appl. No.: 27,523

[22] Filed: Feb. 23, 1998

[30] Foreign Application Priority Data

Dec. 12, 1997 [TW] Taiwan ................... 86118769

[51] Int. Cl.$^6$ .............................................. H01L 21/8242
[52] U.S. Cl. ........................................... 438/253; 438/255
[58] Field of Search .................... 438/250–256, 438/393–399

[56] References Cited

U.S. PATENT DOCUMENTS

5,508,223  4/1996  Tseng .
5,573,968  11/1996  Park .

*Primary Examiner*—Jey Tsai
*Attorney, Agent, or Firm*—Merchant, Gould, Smith, Edell, Welter & Schmidt, P.A.

[57] ABSTRACT

A method for fabricating a semiconductor device is provided comprising forming a dual silicon nitride spacer to be an etching step layer during a self-aligned contact etching step. The invention discloses a bottom electrode with a tri-forked structure and a hemispherical grain layer of a capacitor, therefore the capacitor has a larger surface area. So the capacitor made by the invention has a high capacitance even though the planar surface size is reduced continually.

28 Claims, 10 Drawing Sheets

METHOD OF FABRICATING DRAM CAPACITORS

CROSS-REFERENCE TO RELATED APPLICATION

This application claims the priority benefit of Taiwan application serial no. 86118769, filed Dec. 12, 1997, the full disclosure of which is incorporated herein by reference.

BACKGROUND OF THE INVENTION

1. Field of the Invention

The present invention relates to a method for fabricating a semiconductor device. More particularly, the present invention relates to a dynamic random access memory (DRAM) capacitor structure and its method of fabrication.

2. Description of the Related Art

Figure 1:
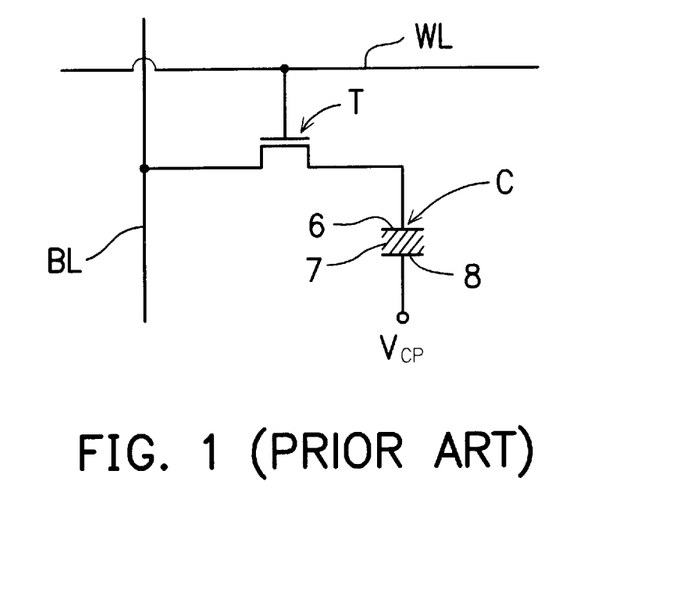
FIG. 1 is the circuit diagram of a memory cell of a DRAM device.

DRAM is now extensively used in all kinds of integrated circuit devices, and has become an indispensable element to the electronic industries in this information age. FIG. 1 is the circuit diagram of a memory cell or memory unit of a DRAM device. As shown in FIG. 1, the memory cell comprises a pass transistor T and a storage capacitor C. The source terminal of the pass transistor T is connected to a bit line (BL), the drain terminal is connected to a storage electrode 6 of the storage capacitor C, the gate terminal is connected to a word line (WL) and the opposed electrode 8 of the storage capacitor C is connected to a fixed voltage source. Between the storage electrode 6 and the opposed electrode 8, there is a dielectric layer 7. Those who are familiar with the art of semiconductor manufacture may know, the capacitor C is used for storing up digital data, and therefore must have a sufficiently large capacitance to avoid rapid data lost.

Figure 2:
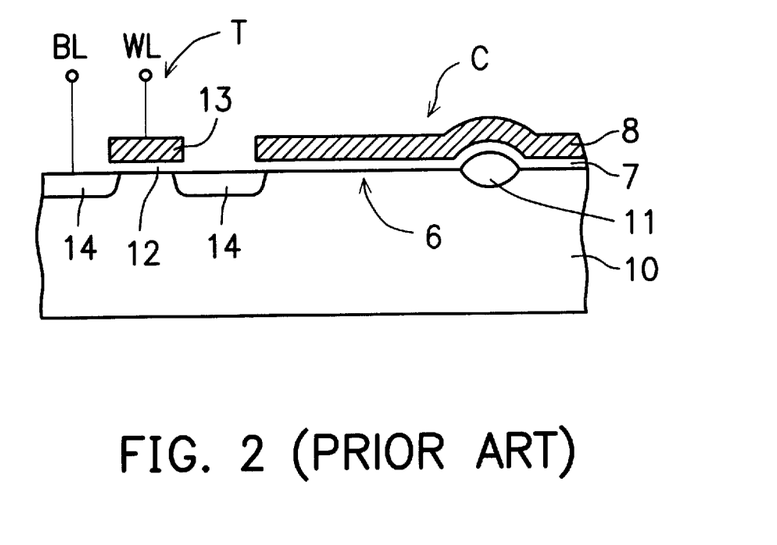
FIG. 2 is a cross-sectional view of a conventional planar-type DRAM capacitor.

In the fabrication of conventional DRAMs having a memory capacity of 1 MB or less, a two dimensional capacitor device, generally known as the planar-type capacitor, is often employed for the storage of digital data. FIG. 2 is a cross-sectional view of a conventional planar-type DRAM capacitor. As shown in FIG. 2, a silicon substrate 10 is first provided. Then, a field oxide layer 11 is formed on the substrate 10 to define the active regions. Next, a gate oxide layer 12, a gate oxide layer 13 and source/drain regions 14 are sequentially formed on the substrate 10 constituting a pass transistor T. In a subsequent step, a dielectric layer 7 and a conducting layer 8 are sequentially formed over portions of the substrate neighboring the drain terminal. The region 6 where the dielectric layer 7 and the conducting layer 8 overlap the substrate 10 forms a storage capacitor C. Quite obvious from the above planar-type capacitor structure, a relatively large surface area is required to form a storage capacitor C that has sufficient capacitance. Hence, this design is unable to meet the demand of ever increasing level of integration for DRAM devices.

In general, highly integrate DRAMs, for example, those bigger than about 4 MB memory capacitor, requires three dimensional capacitor structures such as the stack-type or the trench-type structure for the capacitor devices.

Figure 3:
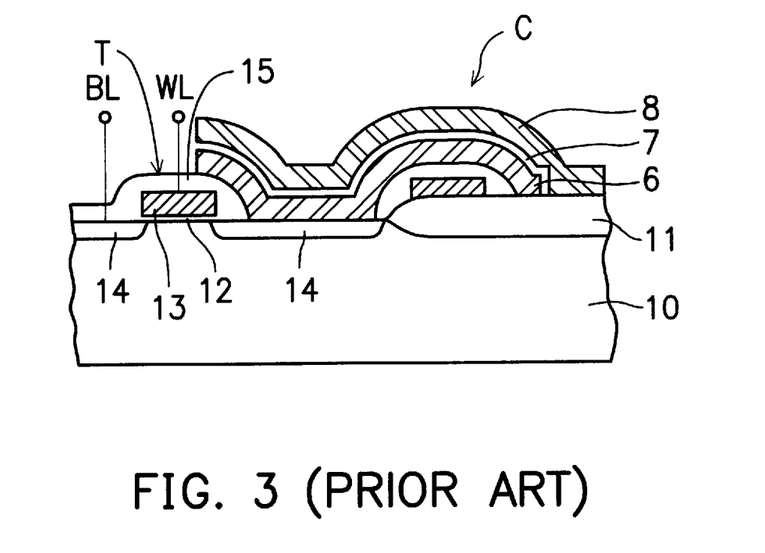
FIG. 3 is a cross-sectional view of a conventional stack-type DRAM capacitor.

FIG. 3 is a cross-sectional view of a conventional stack-type capacitor structure. As shown in FIG. 3, a field oxide layer 11, a gate oxide layer 12, a gate oxide layer 13 and source/drain regions 14 are sequentially formed above a substrate 10 constituting a pass transistor T. Thereafter, an insulating layer 15 is formed over the substrate 10, then a contact opening 14 is etched out exposing portions of a source/drain region 14. Subsequently, a polysilicon layer 6 (functioning as the storage electrode), a dielectric layer 7 and a conducting layer 8 (functioning as the opposed electrode) are sequentially formed over the contact opening, thus establishing a stack-type DRAM capacitor memory cell. The above stack-type capacitor structure is capable of supplying a sufficiently large amount of capacitance with relatively good device integrity. However, for higher level of integration, such as in a 64 MB or bigger storage capacity DRAM, even a simple stack-type capacitor structure is insufficient.

Figure 4:
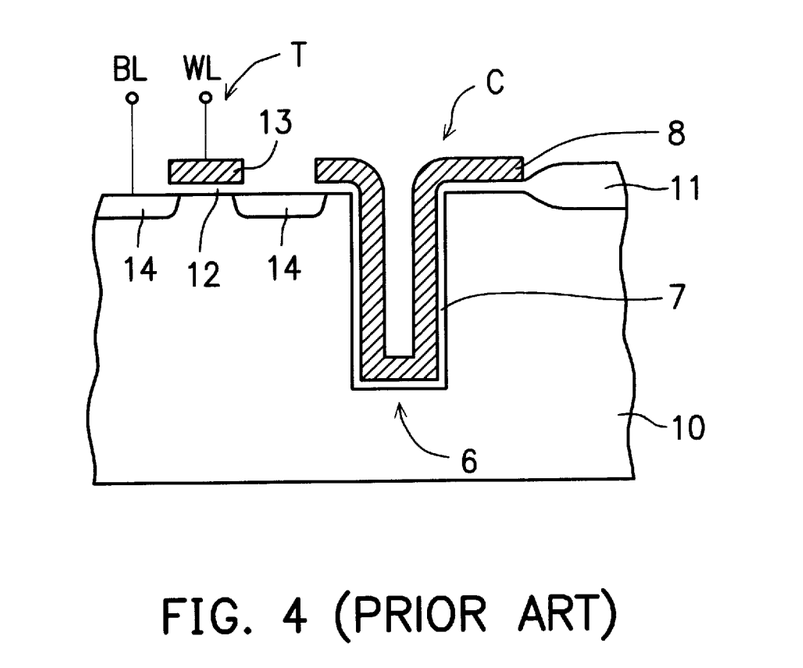
FIG. 4 is a cross-sectional view of a conventional trench-type DRAM capacitor.

On the other hand. Another means of increasing the capacitance is to produce a trench-type capacitor. FIG. 4 is a cross-sectional view of a conventional trench-type capacitor structure. As shown in FIG. 4, processes very similar to the fabrication of a stack-type capacitor are first performed forming a pass transistor T over a silicon substrate 10. The pass transistor T includes a gate oxide layer 12, a gate oxide layer 13 and a source/drain region 14. A deep trench is formed by etching the substrate 10 neighboring a grain terminal 14, and then a storage capacitor C is formed inside the trench region. The storage capacitor C is formed on the side walls of the trench and comprises a storage electrode 6, a dielectric layer 7 and a polysilicon opposed electrode 8. The above trench-type capacitor is also capable of increasing the surface area of the electrode and hence increasing capacitance. However, etching the substrate 10 to form a trench may cause some damages to the crystal lattice, and leakage may increase as a result, thereby affecting the operational characteristics of the device. In addition, as the aspect ratio of the trench is increased, the etching rate will correspondingly be reduced. And therefore, fabrication becomes more difficult and productivity is certain to be affected.

In light of the foregoing, there is a need for increasing the capacitance in a DRAM capacitor.

SUMMARY OF THE INVENTION

It is an object of the invention to provide method of fabricating a DRAM capacitor that is capable of maintaining sufficient capacitance despite the ever-shrinking planar surface area available for the placement of a device due to miniaturization.

In accordance with the foregoing and other objectives of the present invention, a method of fabricating a DRAM capacitor is provided. The method of fabricating a DRAM capacitor includes the following steps of: first forming a transistor on a substrate, wherein a first spacer is provided around a side wall of the transistor and a first silicon nitride layer is formed on the transistor. A first oxide layer is formed and patterned to form a contact window to expose a drain region of the transistor. A bit line is formed in sequence, and connects to the drain of the transistor. A second silicon nitride layer is formed over the bit line, and is etched to form a second spacer around a side wall of the bit line by a step of flow. A third silicon nitride is formed on the first oxide, the bit line and the second spacer in sequence. On the third silicon nitride layer, a second oxide layer is formed. Then, the third oxide layer, the third silicon nitride layer and the second oxide layer are patterned to expose a source region of the transistor. At the same time, a plug is formed to couple with the source of the transistor exposed in the forgoing step. Wherein the process about forming the plug comprises depositing a layer of plug material on the third oxide layer, and making a coupling with the exposed source region. The plug material is polished until its height is flush with the third oxide layer. Further, the third oxide layer and the second layer are patterned to form a cylindrical structure. A polysilicon layer is formed on the cylindrical structures and a top surface of the plug is removed to expose the cylindrical structures. The cylindrical structure exposed in the forgoing step is removed to convert the polysilicon layer to a bottom electrode. Then, on the electrode, a dielectric layer is formed and a top electrode is formed on it.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 5A:
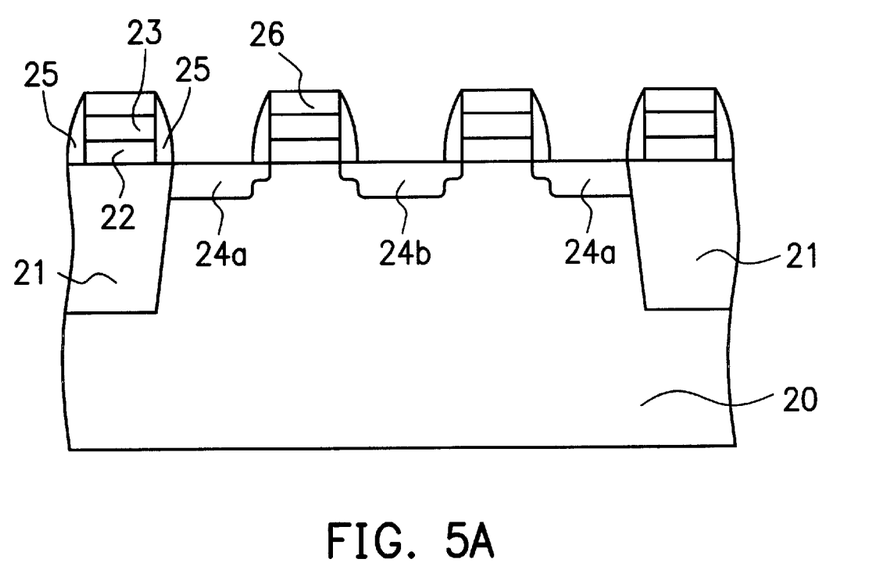
FIG. 5A to 5P are cross-sectional views showing the progression of manufacturing steps for forming a DRAM capacitor in one preferred embodiment according to the invention.
Figure 5B:
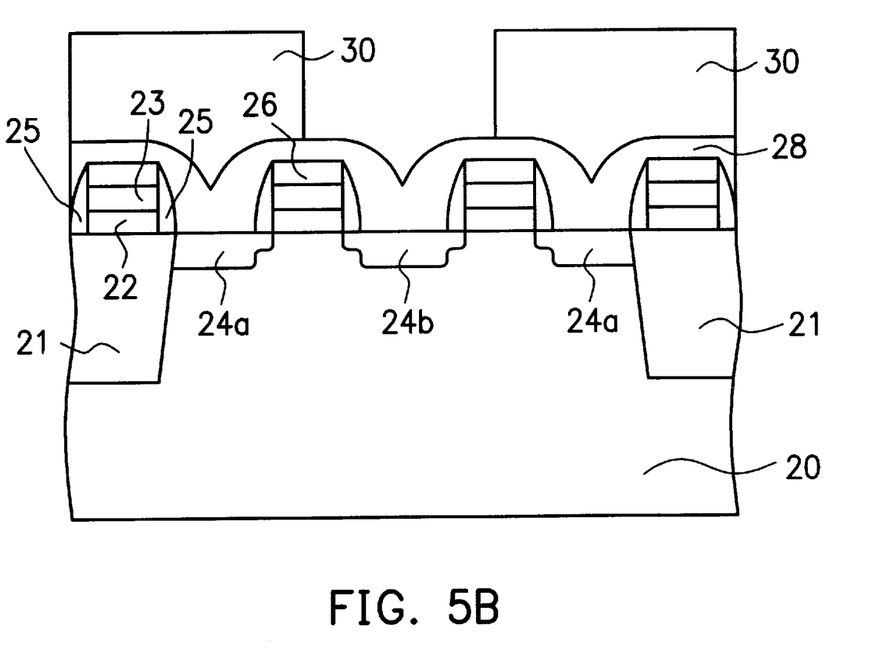
Figure 5C:
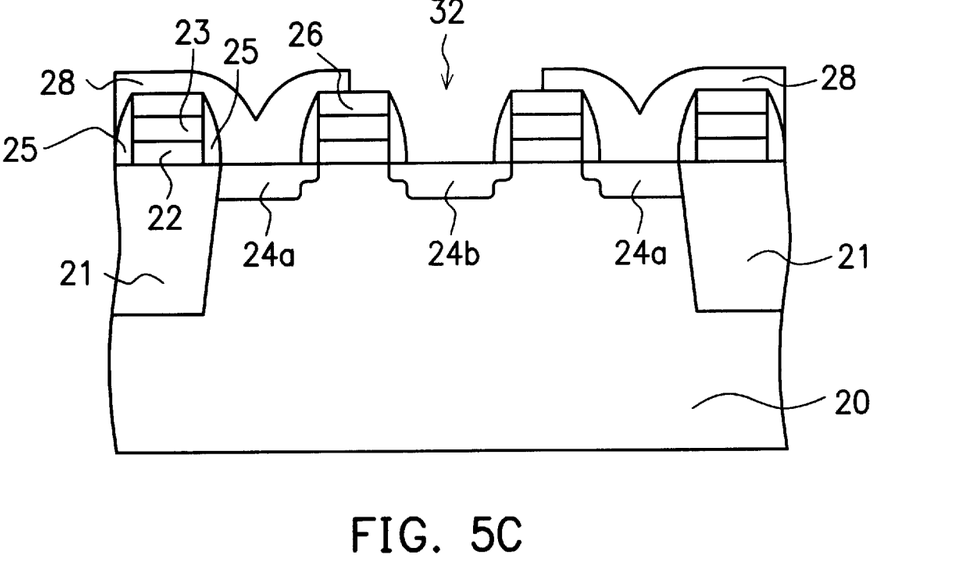
Figure 5D:
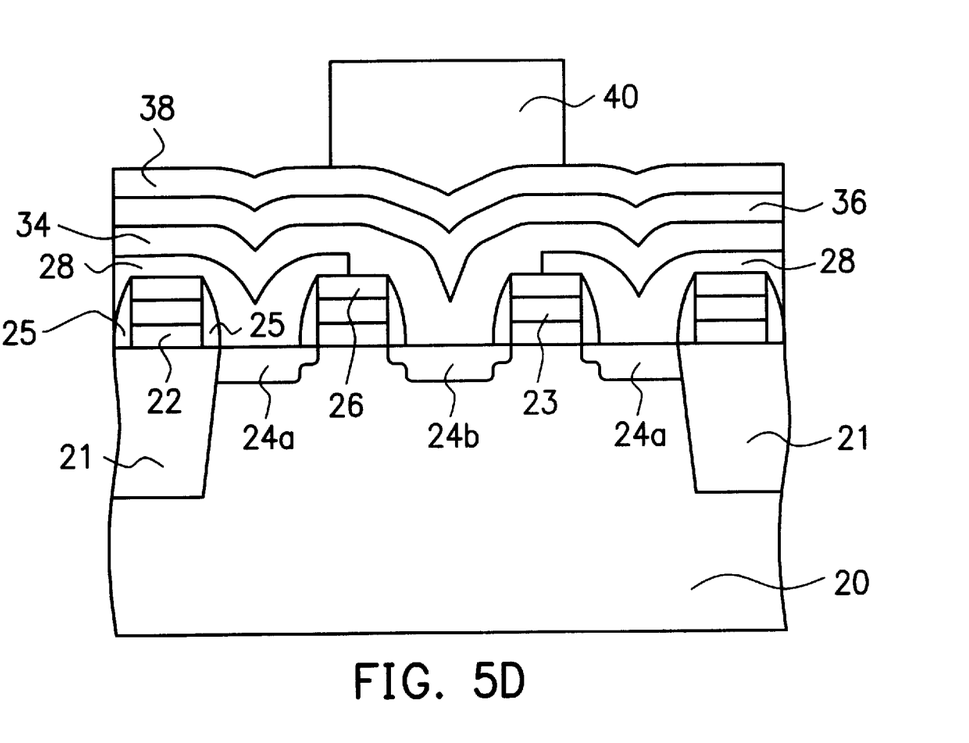
Figure 5E:
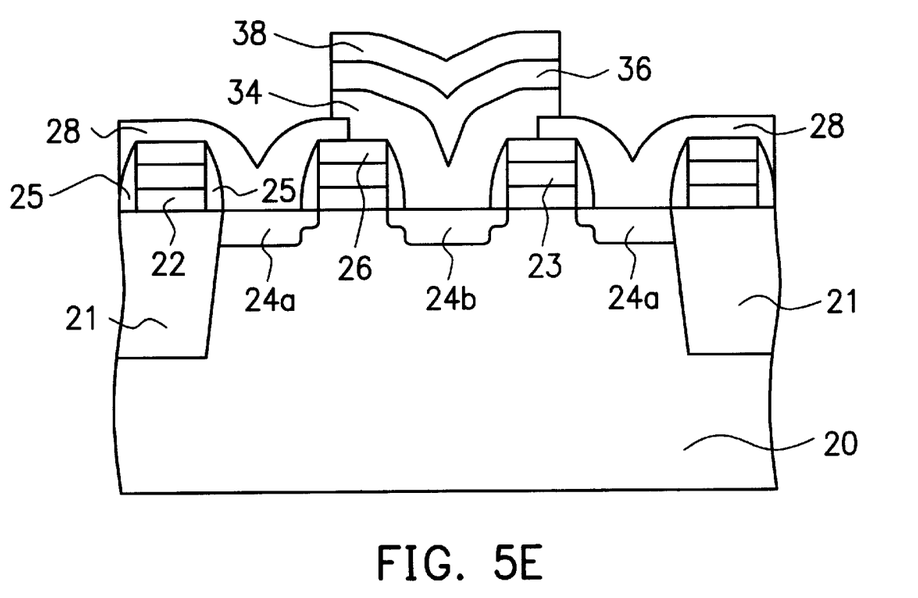
Figure 5F:
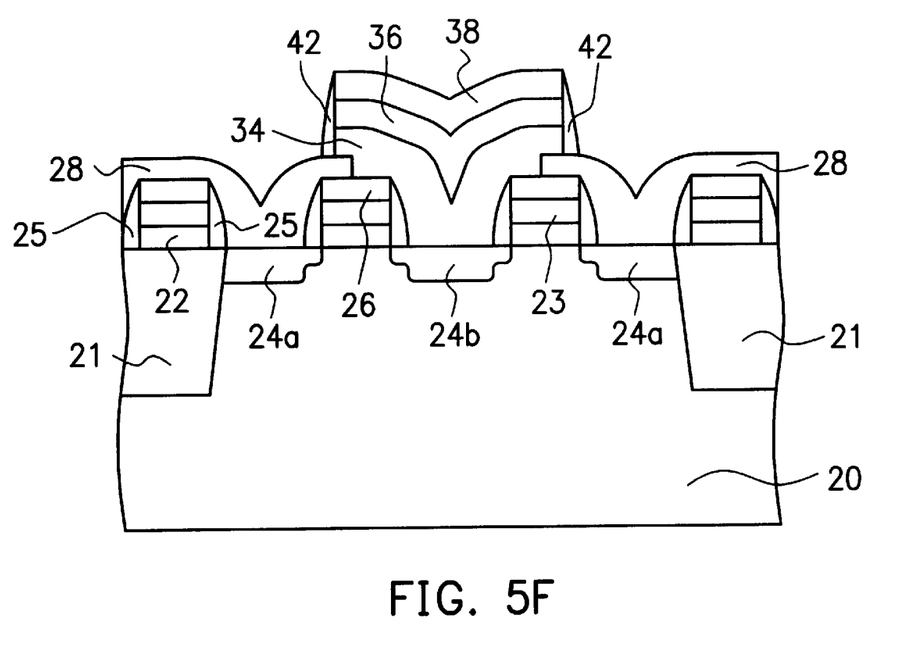
Figure 5G:
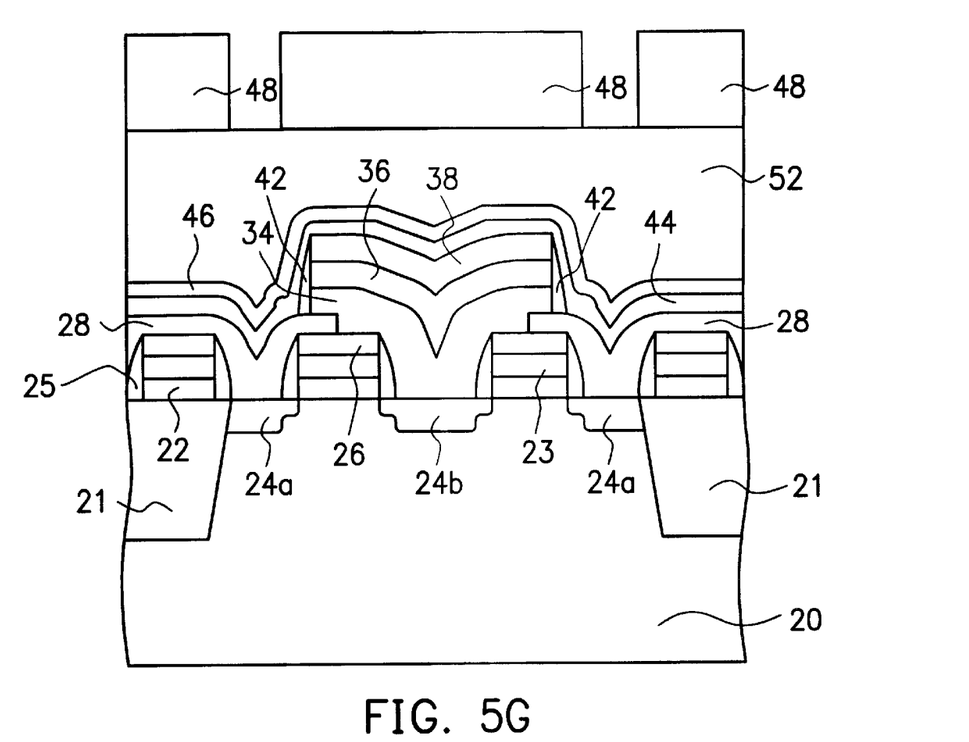
Figure 5H:
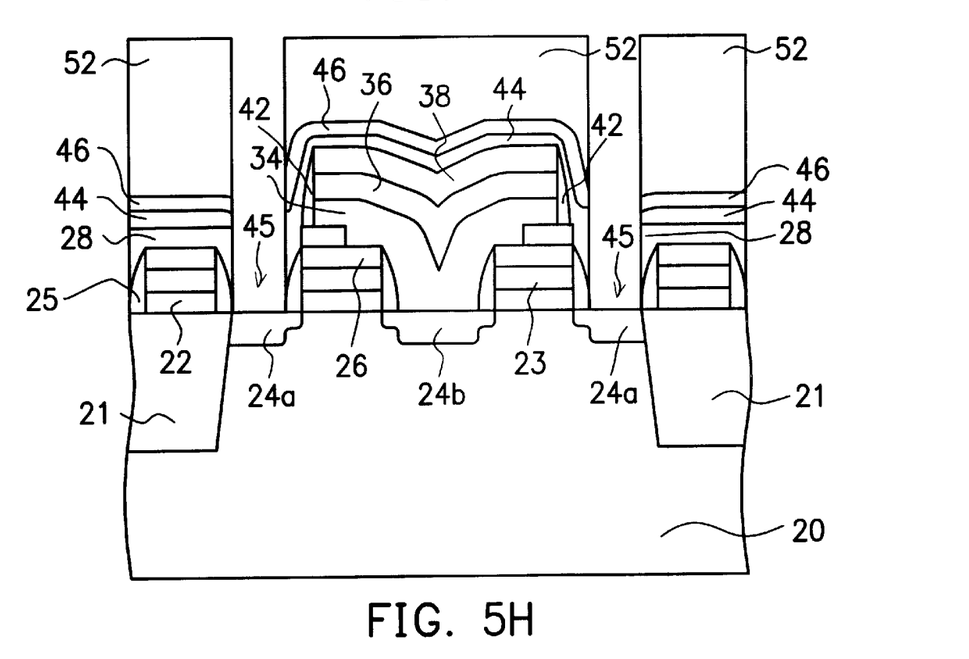
Figure 5I:
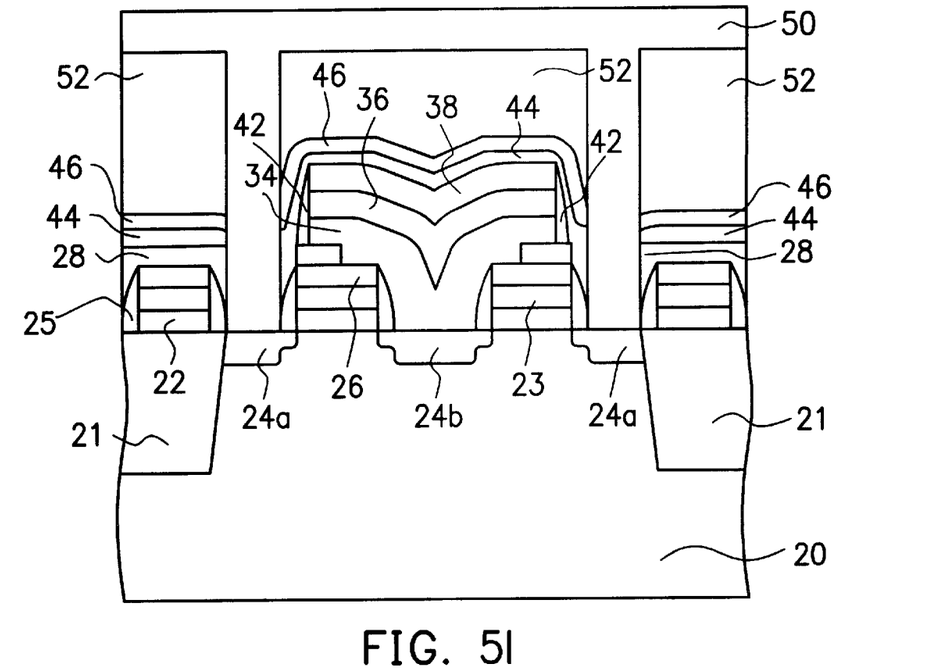
Figure 5J:
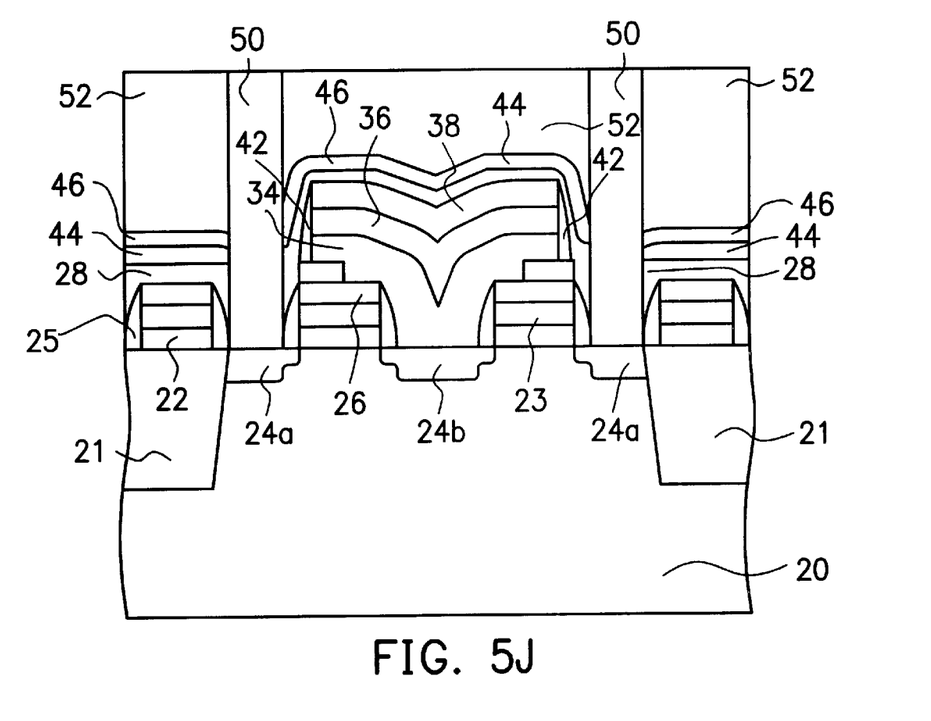
Figure 5K:
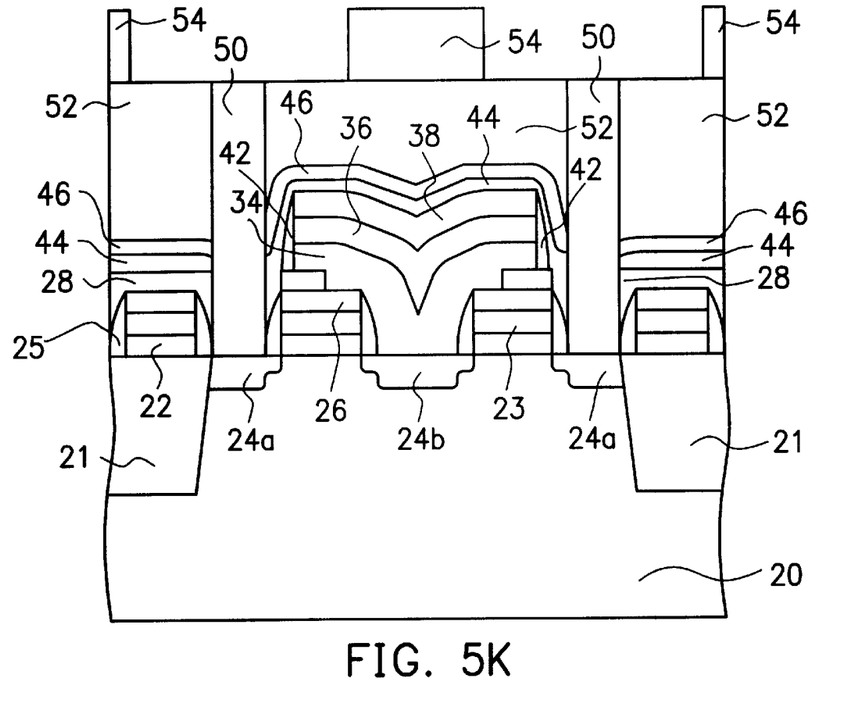
Figure 5L:
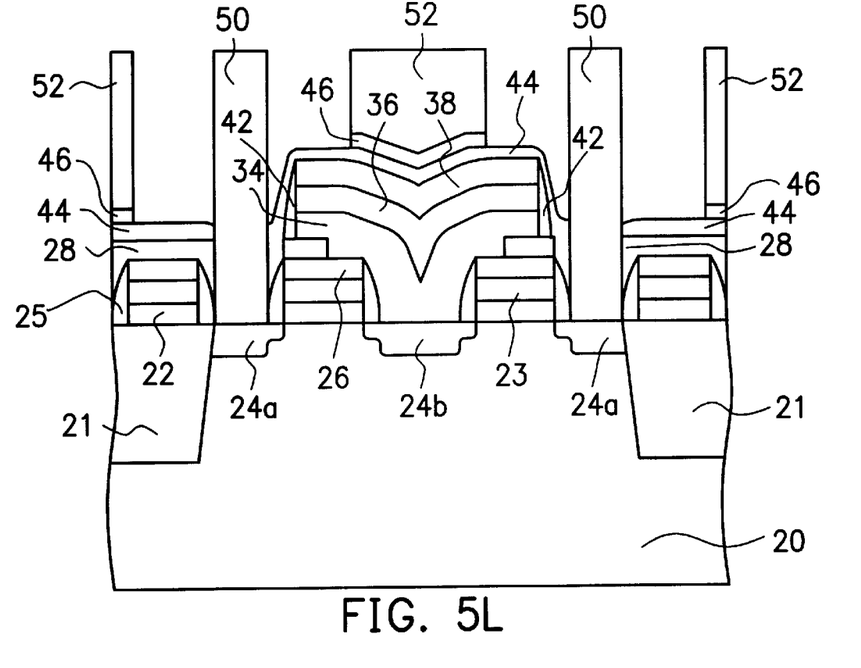
Figure 5M:
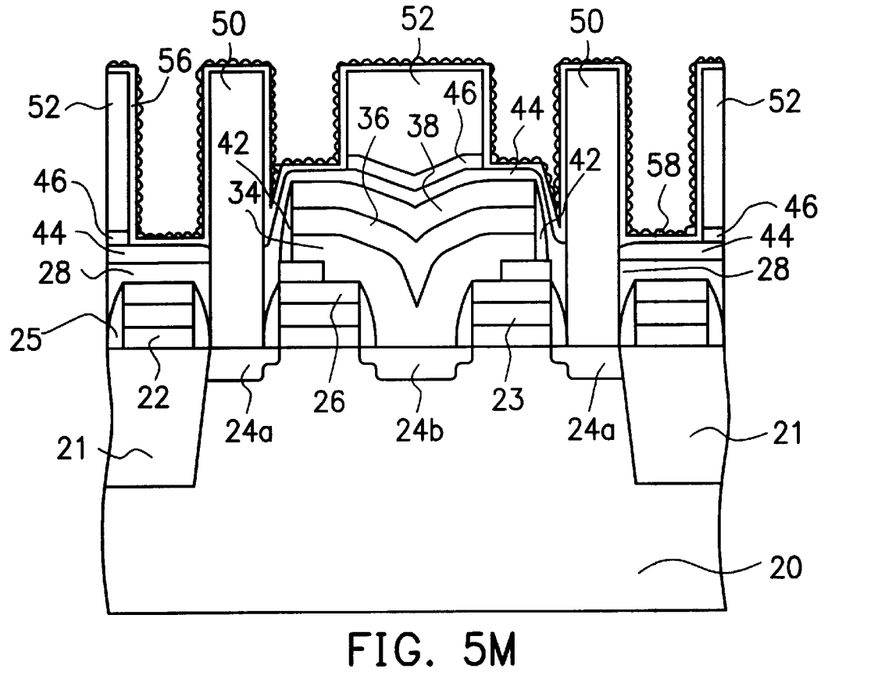
Figure 5N:
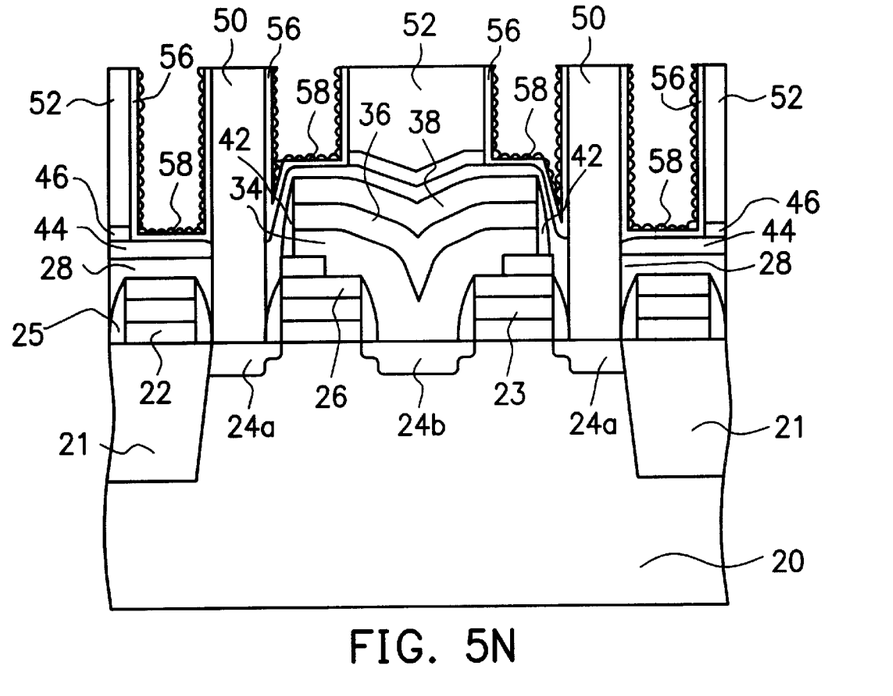
Figure 5O:
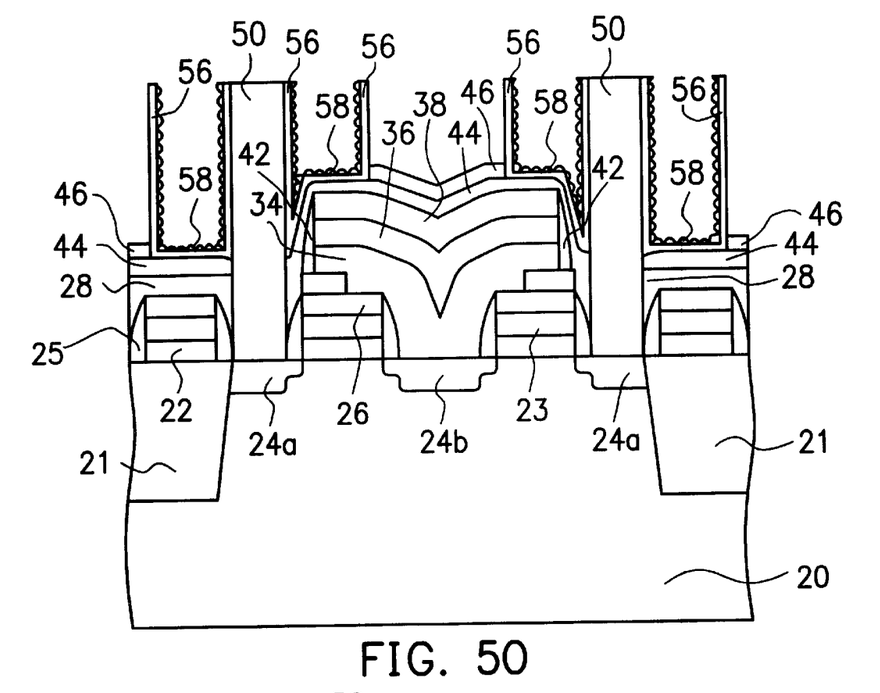
Figure 5P:
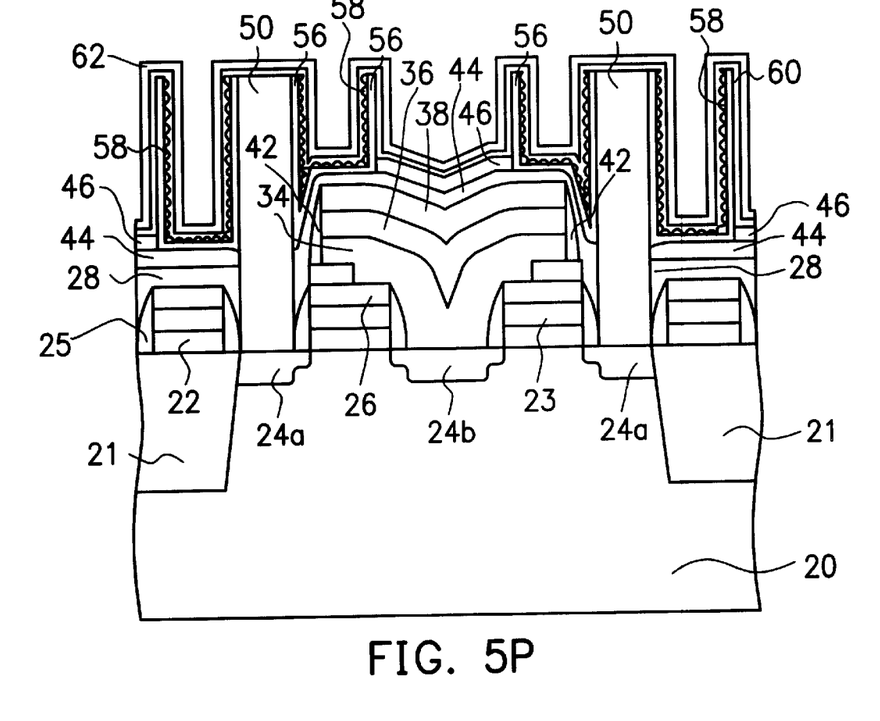

FIG. 5A to 5P are cross-sectional views showing a method for fabricating a semiconductor device in one preferred embodiment according to the invention.

Referring first to FIG. 5A, shallow trench isolation structures 21 are formed in a silicon substrate 20 for defining at least an active region, on which there is a transistor provided. The transistor comprises a gate and source/drain regions 24a and 24b. The gate includes a first polysilicon layer 22, a tungsten silicide layer 23 and a silicon nitride layer 26. A thickness of first polysilicon layer 22 is about 500 to 1500 Å, and the preferred thickness is 1000 Å. A thickness of tungsten silicide layer 23 is about 500 to 1500 Å, and the preferred thickness is 1000 Å. Additionally, a thickness of silicon nitride layer 26 is about 2000 Å. For example, the first polysilicon layer 22 and the tungsten silicide layer 23 are formed by low pressure chemical vapor deposition (LPCVD) process. The silicon nitride layer 26 is formed by a plasma enhanced chemical vapor deposition (PECVD) process. Further, the source/drain regions 24a and 24b are doped lightly before the back-end process to form a spacer.

Then, a material, for example, silicon nitride is formed by PECVD with a thickness of about 1500 Å on the entire substrate structure. The silicon nitride material is etched back, for example, by anisotropic etching. Then, the spacer 25 is formed on a side wall of the gate. Further, the source/drain regions 24a and 24b are exposed respectively at two sides of the gate. After the step of flow, the source/drain regions 24a and 24b are implanted with heavy impurities by using ion implants using the spacer 25 for a mask. Since the material of the spacer is silicon nitride, it can be an etching stop layer in a back-end etching step.

Referring to FIG. 5B, an oxide layer 28, for example, a silicon oxide layer or the like formed by atmosphere pressure chemical vapor deposition (APCVD) is formed with a thickness of about 1000 to 2000 Å on the entire substrate structure. Then, a photoresistant area 30 is used on the oxide layer 28 and patterned to form a contact area of a bit line.

Referring to FIG. 5C, the oxide layer 28 is etched to form the contact coupling with the bit line. The contact 32 exposes the source/drain regions 24a and 24b, for example, a source region. One feature of the invention is using the spacer 25 of silicon nitride to be the etch stop layer, so the etch step is a self-aligned contact (SAC) etching step. The photoresistant area is removed after the contact 32 is formed.

Referring to FIG. 5D, a doped polysilicon layer is formed, for example, by PECVD with a thickness about 1000 Å on the entire substrate structure and filled into the contact 32 connecting to the source/drain region 24b. A drain region is exposed at the contact 32 to form a second polysilicon layer 34. Then, A tungsten silicide layer 36 is formed, for example, by LPCVD with a thickness about 1000 Å on the second polysilicon layer 34. A silicon nitride layer 38 is formed, for example, by PECVD with a thickness about 2000 Å on the tungsten silicide layer 36. Then, a photoresistant area 40 is formed on a particular area of a top surface of the silicon nitride layer 38.

Referring to FIG. 5E, the structure showed at the FIG. 5E is formed by using conventional photolithography to etch the silicon nitride layer 38, the tungsten silicide layer 36 and the second polysilicon layer 34 not covered by the photoresistant area 40. Wherein, the silicon nitride layer 38, the tungsten silicide layer 36 and the polysilicon layer 34 showed in FIG. 5E combine to form a bit line.

Referring to FIG. 5F, a material, for example, silicon nitride is deposited by PECVD on the entire substrate. Then, the silicon nitride material is etched back, for example, by anisotropic etching and the spacer 42 is formed on a side wall of the silicon nitride layer 38, tungsten silicide layer 36 and the polysilicon layer 34.

Referring to FIG. 5G, a silicon nitride layer 44 is formed, for example, by PECVD with a thickness about 300 Å over the entire substrate structure. Then, a oxide layer 46 is formed, for example, by APCVD with a thickness about 1500 Å on the silicon nitride layer 44 and a oxide layer 52 with a thickness about 15000 Å is deposited, for example, by PECVD on the entire substrate structure in sequence. The oxide layer 52 is, for example, a borophosphosilicate glass (BPSG) layer. Then, the oxide layer 52 is flowed again at a temperature about 800° C. After the step of flow, the oxide layer 52 is planarized, for example, by a chemical mechanical polishing (CMP) process. A photoresistant area 48 is formed on a particular area of the oxide layer 52. Since the dual silicon nitride spacer is used to be an etching step layer, the photoresistant area 48 can cover a larger area of the oxide layer 52 in this invention. The photoresistant area 48 exposes some regions corresponding to the source/drain regions.

Referring to FIG. 5H, the photoresistant area 48 is etched to expose the oxide layer 52. Further, the silicon nitride layer 44 and the oxide layer 28 are etched to form a contact window 45 to expose the source/drain region 24a, for example, a source region. The photoresistant area 48 is removed to form a structure showed in FIG. 5H. Since, one feature of the invention is using the spacer 42 of silicon nitride to avoid damages at the transistor gate during the etching step, a width of the contact window 45 can be larger to decrease the height/width ratio of the contract window 45. Furthermore, the etching step is a self-aligned contact etching step designed to avoid a disadvantages of misalignment during the etching step.

Referring to FIG. 5I, a plug material is deposited, for example, by LPCVD with a thickness about 2000 Å on the entire substrate structure. The plug material, for example, is doped polysilicon forming a polysilicon plug 50 and it connects to the source/drain region 24a, for example, a source region exposed from the contact window 45.

Referring to FIG. 5J, the polysilicon plug 50 on the oxide layer 52 is removed, for example, by CMP until the oxide layer 52 exposed.

Referring to FIG. 5K, a photoresistant area 54 is provided on a particular area of the oxide layer 52.

Referring to FIG. 5L, the oxide layer 52 uncovered while the photoresistant area 54 is etched. Further, the oxide layer 46 under the oxide layer 52 is etched, whereby the oxide layer 46 and the oxide layer 52 form a cylindrical structure. The silicon layer 44 is used to be an etching stop layer during the etching step, and the silicon nitride spacer 42 can protect the gate. The etching step can be a self-aligned contact etching step.

Referring to FIG. 5M, a third polysilicon layer 56 is formed alongside the substrate shape by depositing a doped polysilicon material with a thickness about 500 Å on the substrate. Additionally, a polysilicon layer of hemispherical grains 58 is formed.

Referring to FIG. 5N, the third polysilicon layer 56 and the polysilicon layer of hemispherical grains 58 over the oxide layer 52 are removed, for example, by CMP until a top surface of the oxide layer 52 is exposed. The third polysilicon layer 56 forms a tri-forked structure. Then, the substrate structure formed in forgoing step is scrubbed, for example, by using a ONTRACK scrubber for about 120 seconds. The ONTRACK scrubber uses an $NH_4OH$ solution, a HF 100:1 solution and spin dry by the number.

Referring to FIG. 5O, an etching step is provided by using a buffer oxide etchant (BOE) with a ratio of 20:1 about 400 to 600 seconds to remove the oxide layer 52 and the oxide layer 46. The polysilicon layer of hemispherical grains 58, described in the process showed in the FIG. 5M, may be provided over the top surface of the third polysilicon layer 52 after the steps to remove the oxide layer 52 and the oxide layer 46. The third polysilicon layer 56 and the polysilicon layer of hemispherical grains 58 compose a bottom electrode, therefore the bottom electrode of a capacitor described in this invention has a tri-forked structure.

Referring to FIG. 5P, a dielectric layer 60 is provided on a surface of the bottom electrode. A conductive layer, for example, a doped polysilicon layer is provided to form a fourth polysilicon layer 62 on the dielectric layer 60 with a thickness of about 500 to 1000 Å as the top electrode of the capacitor, and the material of the dielectric layer 60 is oxide/nitride/oxide, such as TiN and $Ta_2O_5$.

Then, back-end processes are continued to finish the manufacturing of the capacitors. The back-end processes have no relation to the invention, so the technology of the back-end processes isn't described.

One feature of the invention is the dual spacer used to be an etching step layer, so the contact etching step is a self-aligned etching step and the step can avoid disadvantages formed to misalign.

Another feature of the invention is the spacer of silicon nitride which can protect the bit line and the gate during the proceeding etching steps. The width of the contact window can increase to form the contact with a smaller height/width ratio.

Still another feature of the invention is the bottom electrode with a tri-forked structure and the hemispherical grains layer, whereby the bottom electrode has a larger surface area. In addition, the dielectric layer is $Ta_2O_5$. It makes the capacitor having a high capacitance in a condition that the planar surface size is reduced continually.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a semiconductor device, comprising the steps of:

providing a semiconductor substrate including at least a transistor which comprises a first spacer around a side wall of the transistor and a first silicon nitride layer over the transistor;

forming and patterning a first oxide layer to form a contact window to expose a source region therein on the semiconductor substrate;

forming a bit line which couples with the source region on the semiconductor substrate;

forming and patterning a second silicon nitride layer to form a second spacer around a side wall of the bit line;

forming a third silicon nitride layer on the first oxide layer, the bit line and the second spacer;

forming a second oxide layer on the third silicon nitride layer;

forming a third oxide layer on the second oxide layer;

patterning the third oxide layer, the third silicon nitride layer and the second oxide layer to expose a drain region on the semiconductor substrate;

forming a plug which couples with the drain region;

patterning the third oxide layer and the second oxide layer, whereby the third oxide layer and the second oxide layer are made to form a cylindrical structure;

forming a polysilicon layer on the cylindrical structure and a top surface of the plug;

removing the polysilicon layer on the cylindrical structure and the top surface of the plug about to expose the cylindrical structure;

removing the exposed cylindrical structure, whereby the polysilicon layer formes a bottom electrode;

forming a dielectric layer on the bottom electrode; and forming a top electrode on the dielectric layer.

2. A method according to claim 1, wherein the bit line is formed comprising the step of:

forming a polysilicon layer on the semiconductor substrate and coupling with the exposed source region;

forming a tungsten silicide layer on the polysilicon layer;

forming the second silicon nitride layer on the tungsten silicide layer; and patterning the polysilicon layer, the tungsten silicide layer and the second nitride layer to form the bit line.

3. A method according to claim 2, wherein the polysilicon layer is formed by low pressure chemical vapor deposition process.

4. A method according to claim 2, wherein the tungsten silicide layer is formed by low pressure chemical vapor deposition process.

5. A method according to claim 2, wherein the second silicon nitride layer is formed by plasma enhanced chemical vapor deposition process.

6. A method according to claim 1, wherein the first oxide layer and the second oxide layer are formed by atmospheric pressure chemical vapor deposition process.

7. A method according to claim 1, wherein the third oxide layer is formed by the plasma enhanced chemical vapor deposition process.

8. A method according to claim 1, wherein including a step to polish the third oxide layer after forming the third oxide layer and before patterning the third oxide layer.

9. A method according to claim 8, wherein the third oxide layer is polished by chemical mechanical polishing process.

10. A method according to claim 1, wherein the second spacer is formed comprising depositing a spacer material on the bit line and etching back the spacer material to form the second spacer around a side wall of the bit line.

11. A method according to claim 1, wherein the polysilicon layer is formed by low pressure chemical vapor deposition process.

12. A method according to claim 1, wherein the first silicon nitride layer, the second silicon nitride layer and the third silicon nitride layer are formed by plasma enhanced chemical vapor deposition process.

13. A method according to claim 1, wherein the plug is formed by depositing a plug material layer on the third oxide layer, and coupling with the exposed drain region, and polishing the plug material layer until a height is flush with the third oxide layer.

14. A method according to claim 1, wherein the polysilicon layer on the cylindrical structure is removed and the top surface of the plug about exposed to the cylindrical structure is performed by chemical mechanical polishing process.

15. A method according to claim 1, wherein a hemispherical grain layer is formed on the polysilicon layer after forming the polysilicon layer and before exposing the cylindrical structure.

16. A method according to claim 15, where the step of removing the polysilicon layer from the cylindrical structure further comprises removing the hemispherical grain layer on a top surface of the cylindrical structure.

17. A method according to claim 15, wherein the dielectric layer is formed on the hemispherical grain layer.

18. A method according to claim 1 which comprises the step of forming a hemispherical grain layer on a surface of the polysilicon after removing the cylindrical structure and before forming the dielectric layer.

19. A method according to claim 18, wherein the dielectric layer is further formed on the hemispherical grain layer.

20. A method according to claim 1, wherein structures of the transistor comprise ordinal a polysilicon layer, a tungsten silicide layer and the first silicon nitride layer, wherein the first silicon nitride layer is overhead.

21. A method according to claim 1, wherein structures of the bit line comprise ordinal a polysilicon layer, a tungsten silicide layer and the second silicon nitride layer, wherein the first silicon nitride layer is overhead.

22. A method according to claim 1, where the material of the first spacer is silicon nitride.

23. A method according to claim 1, wherein the material of the second spacer is silicon nitride.

24. A method according to claim 1, wherein the material of the third oxide layer is borophosphosilicate glass.

25. A method according to claim 1, wherein the material of the dielectric layer is oxide/nitride/oxide.

26. A method according to claim 1, wherein the material of the dielectric layer is $Ta_2O_5$.

27. A method according to claim 26, wherein the material of the top electrode is Ti/TiN.

28. A method according to claim 1, wherein the material of the plug is polysilicon.

* * * * *